(12) United States Patent
Tamai et al.

(10) Patent No.: US 6,570,369 B2
(45) Date of Patent: May 27, 2003

(54) REGULATOR WITH INTEGRATABLE PULSE DRIVE SIGNAL

(75) Inventors: Yasuhiro Tamai, Shizuoka-ken (JP); Tetsuya Hasegawa, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/104,026

(22) Filed: Mar. 25, 2002

(65) Prior Publication Data

US 2002/0135344 A1 Sep. 26, 2002

(30) Foreign Application Priority Data

Mar. 26, 2001 (JP) ........................................ 2001-087611

(51) Int. Cl.$^7$ ............................................... G05F 1/40
(52) U.S. Cl. .................. 323/288; 323/908; 323/283
(58) Field of Search ......................... 327/336, 337, 327/170, 108, 374; 323/288, 908, 284, 283

(56) References Cited

U.S. PATENT DOCUMENTS 4,420,804 A * 12/1983 Nishino ................ 363/21.04
5,646,514 A * 7/1997 Tsunetsugu .............. 323/288
5,977,814 A * 11/1999 Ishii ........................ 327/434
6,049,201 A * 4/2000 Feldtkeller ............... 323/288

FOREIGN PATENT DOCUMENTS

JP    5-168164    7/1993

* cited by examiner

*Primary Examiner*—Shawn Riley
(74) *Attorney, Agent, or Firm*—FInnegan, Henderson, Farabow, Garrett & Dunner, L.L.P.

(57) ABSTRACT

A load driving system 1 capable of limiting the generation of an inrush current at the start of driving a load 2. A power source 3 having an output voltage higher than a normal driving voltage of the load is used for driving the load. An FET 4 is connected to the load. A rectangular pulse signal is supplied to the gate of the FET from a pulse generator 5*a*. The signal causes the FET to switch on and off, supplying the current to the load. When an inrush current flows at the start of driving of the load, an integrator 10 provided to the gate of the FET is operated to mitigate the rising characteristics of the pulse signal. This causes the current flowing through the load 2 to rise in a relaxation curve, thereby enabling the limitation of the inrush current.

12 Claims, 5 Drawing Sheets

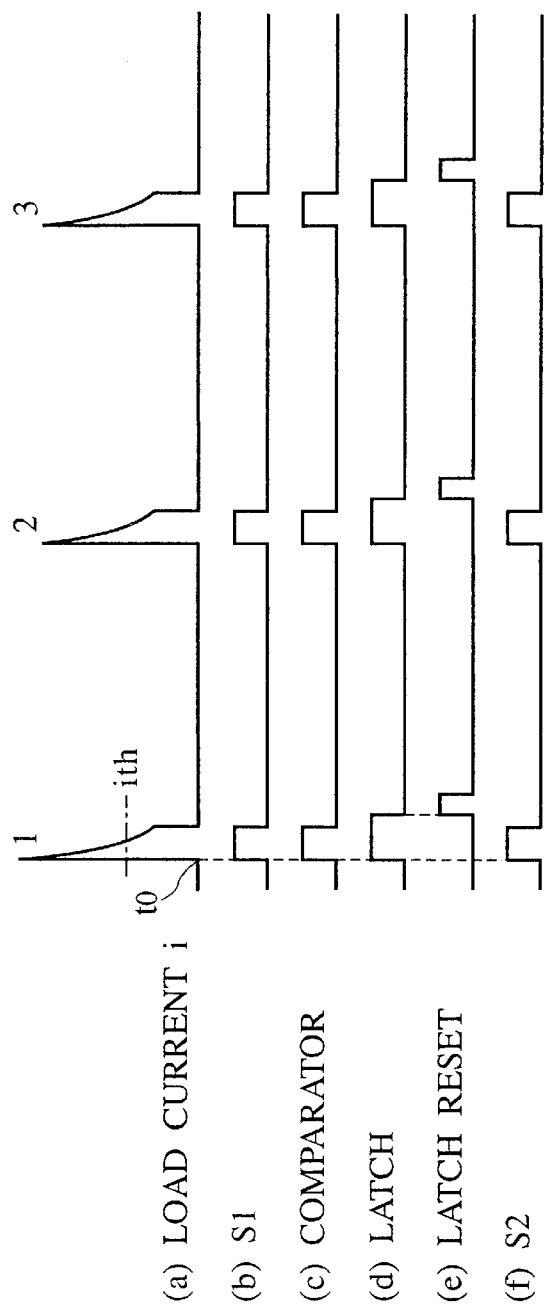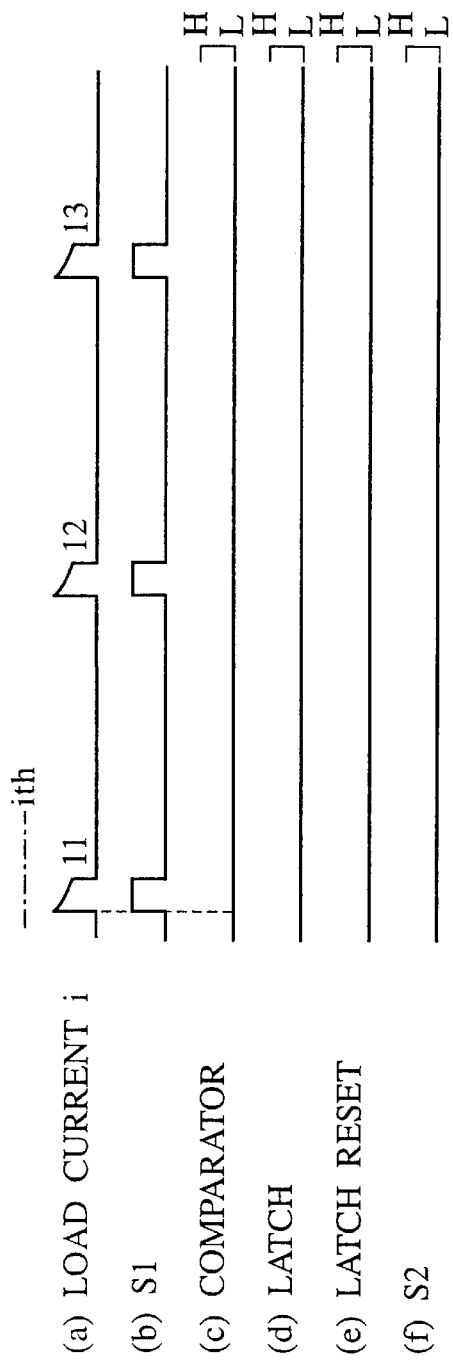
FIG.3A
FIG.3B

REGULATOR WITH INTEGRATABLE PULSE DRIVE SIGNAL

BACKGROUND OF THE INVENTION

1. Field of the Invention

This invention relates to a load driving system and method thereof for driving loads using a power source having an output voltage higher than a normal driving voltage of the loads, and more particularly, to an art of simplifying the circuitry and reducing its heat generating amount.

2. Description of the Related Art

The voltage of a battery power source mounted to vehicles such as automobiles or trucks is generally 12 volts or 24 volts. The recent trend is to use a higher battery voltage (52 volts, for example) in order to reduce the value of the current flowing through various circuits or loads mounted to a vehicle. However, such loads as lamps mounted to a vehicle are designed for a conventional battery voltage of 12 volts or 24 volts, and cannot be driven when being directly connected to a 52-volts DC power source.

It is thus necessary to replace such loads mounted to a vehicle with ones designed for a voltage of 52 volts to match 52-volts battery voltage. However, such increase in a driving voltage of such lamps as head lamps, tail lamps, brake lamps and room lamps mounted to a vehicle (that is, designing the lamps for 52 volts) results in increase in the size of these devices, causing cost increase, and thus being impractical.

Under these circumstances, various kinds of load driving system for driving loads with a voltage higher than a normal driving voltage without undue stress have been proposed and put to practical use. An example of such conventional load driving systems is disclosed in Japanese Patent Laid-Open Publication No. Hei-5-168164 (hereinafter referred to as a "conventional example").

FIG. 1 is a circuit diagram of a load driving system described in the conventional example. As shown in the figure, the load driving system has a DC power source 101 and an FET 106 directly connected to a lamp 102 as a load. The system further includes a voltage detector 104, a PWM controller 105, and a switch 103.

The PWM controller 105 outputs a pulse signal to the FET 106 to cause it to turn on and off so as to make a root-mean-square value of the voltage supplied to the lamp 102 smaller than the output voltage of the DC power source 101, thereby preventing the lamp 102 from being overloaded when illuminated.

However, since the above conventional load driving system uses the DC power source 101 having a voltage higher than the normal driving voltage of the load, the turn-on of the power causes an inrush current flow excessively greater than that in the normal driving voltage operation. This is conspicuous when the load is a lamp. The generation of inrush current causes such a problem as a shortened life of the load.

Accordingly, even though the conventional load driving system can control the turn on and off of the FET 106 by PWM control to drive a load for 12 volts connected to the DC power source 101 outputting a voltage of 52 volts, for example, an excessive inrush current flows at power-on, applying great load to the circuitry, and shortening the life of the load.

SUMMARY OF THE INVENTION

This invention was made to solve the above conventional problems, and to provide a load driving system capable of limiting the generation of an inrush current at power-on.

According to a first technical aspect of this invention, there is provided a driving system 1 connected to a DC power source 3 which supplies a predetermined output voltage, for driving at least one load 2, having a switch 4 for switching on and off of the supply of the voltage outputted from the power source to the load, a pulse generator 5a for generating a pulse for controlling the switch, an integrator 10 connected between the switch and the pulse generator for selectively integrating the current supplied to the load, and a current detector 12 for detecting the current supplied to the load, the current detector having first and second states, and outputting the first state when the current supplied to the load is greater than a predetermined value, or otherwise outputting the second state, wherein, the integrator operates for integration when the output from the current detector is the first state, and does not operate for integration when the output from the current detector is the second state.

According to a second technical aspect of this invention, there is provided A method of driving at least one load 2 using a DC power source 3 supplying a predetermined output voltage, comprising (1) converting a voltage outputted from the power source to a pulse voltage for output, (2) detecting a current supplied to the load and comparing the detected current with a predetermined current value, and (3) selectively integrating the pulse voltage based on the comparison result, wherein, the integration is performed to the pulse voltage when the detected current is greater than the predetermined current value, and otherwise is not performed.

BRIEF DESCRIPTION OF THE DRAWINGS

FIG. 3A is a timing chart illustrating signals immediately after the start of driving of a load, at the respective parts of the load driving system of the first embodiment, and FIG. 3B is a timing chart illustrating signals at the respective parts during the normal driving of the load;

DETAILED DESCRIPTION OF THE PREFERRED EMBODIMENTS

Figure 1:
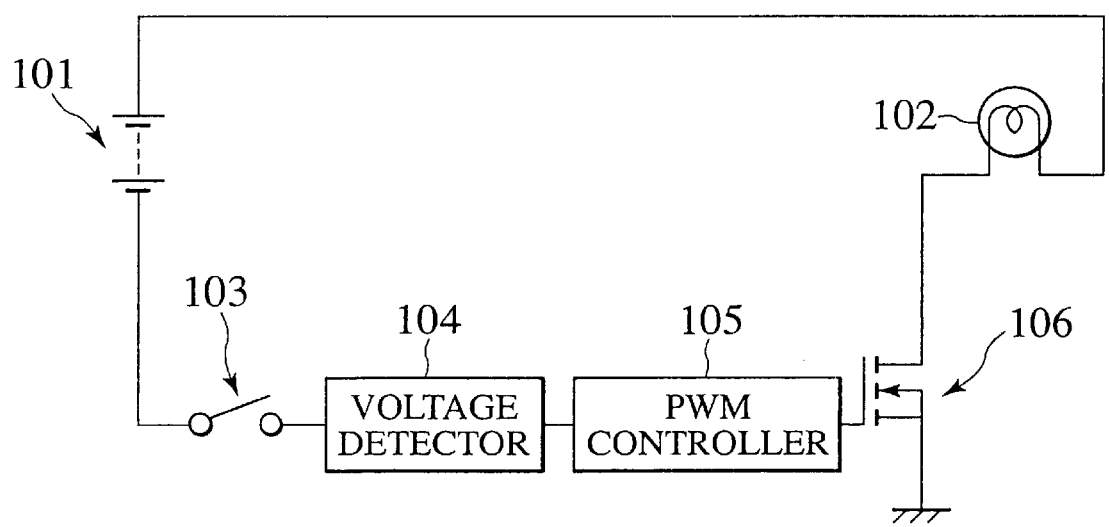
FIG. 1 is a circuit diagram illustrating the construction of a conventional load driving system.
Figure 2:
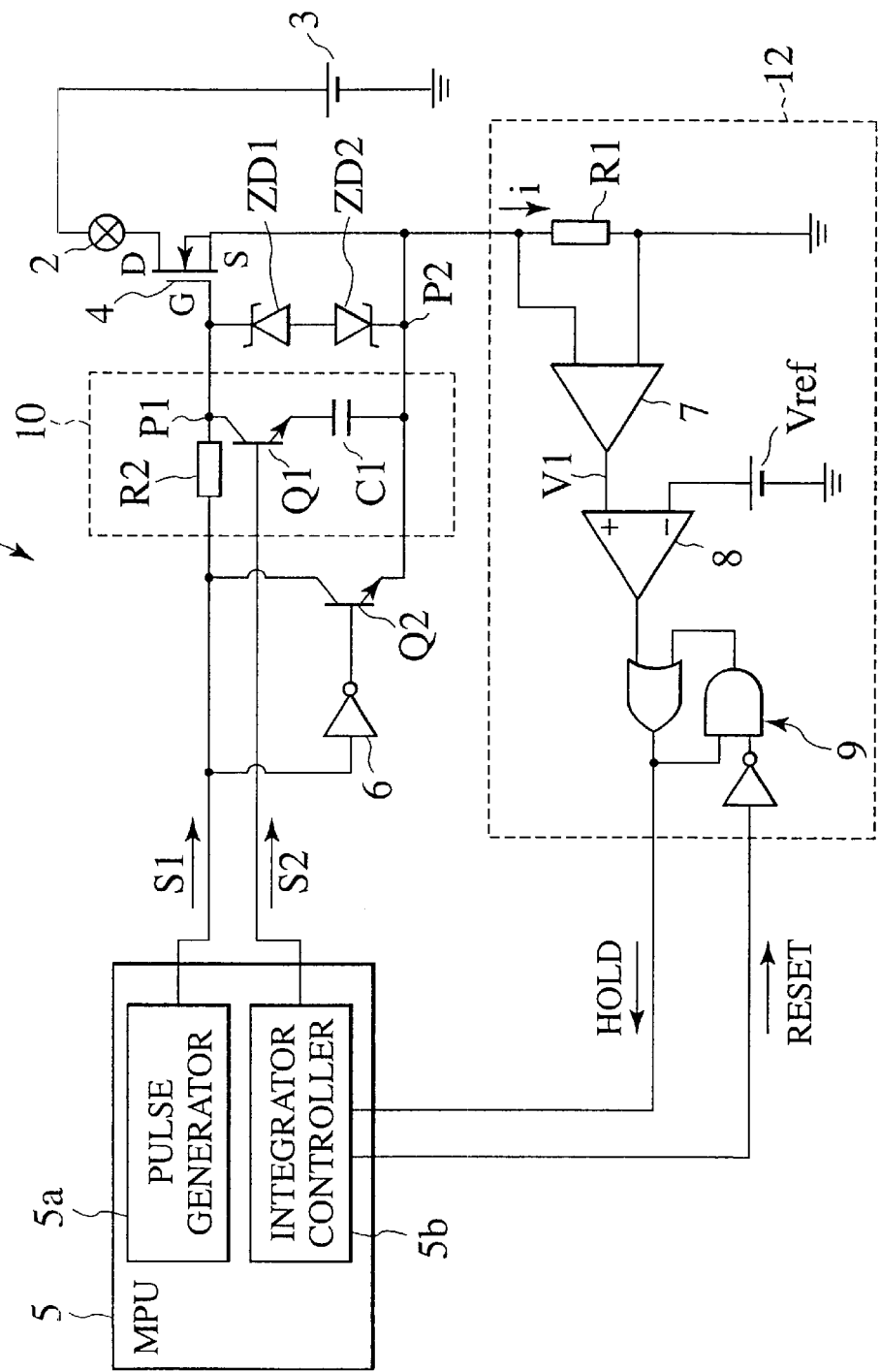
FIG. 2 is a circuit diagram illustrating the construction of a load driving system according to a first embodiment of this invention.

With reference to the accompanying drawings, preferred embodiments of this invention will be described in detail below. FIG. 2 is a circuit diagram illustrating the construction of a load driving system 1 according to a first embodiment of this invention. The load driving system 1 is a switching circuit which is connected between a load 2 such as a lamp and a power supplier 3 via ground, and includes a switch 4 for switching between the supply and the stop of the supply of the voltage outputted from the DC power source 3 to the load 2 by PWM control, an integrator 10 selectively connected to a control input terminal of the switch 4, and a controller 5 for controlling the switch 4, integrator 10, and other components. The load to which this invention is applied is not limited to a single lamp, and may be a plurality of lamps with the same characteristics, for example. The switching circuit 1 can be also connected between the load 2 and the power supplier 3 in such that the load is connected with the ground.

The DC power source 3 is a battery mounted to a vehicle, for example, and supplies a DC voltage of 52 volts, for example. The lamp 2 used in this embodiment is designed for use normally at 12 volts (a specified driving voltage of the lamp 2, hereinafter referred to as a "normal driving voltage"), for example. Accordingly, this invention provides a load driving system for connecting a load designed for use at a normal driving voltage to a DC power source with a voltage higher than the normal driving voltage (hereinafter referred to as a "higher driving voltage") and stably driving the load.

The switch 4 is an FET functioning as an electronic switch in this embodiment. A drain D of the FET 4 is connected to a terminal of the load 2 and a source S is connected to ground via a resistor (shunt resistor) for detecting a load current. A gate G is a control input terminal through which the FET 4 is activated or inactivated depending on an input voltage VGS, thereby controlling the current flowing between the drain D and source S.

The controller 5 is an MPU, and has a pulse generator 5a for outputting a rectangular pulse train of a desired duty ratio (pulse width and pulse interval) to the control input terminal of the switch 4 by PWM control, and an integrator controller 5b for controlling the integrator 10 having predetermined response characteristics. The duty ratio is preferably set to allow an effective value of the power consumption of the load to be within allowable limits.

The pulse generator 5a is connected via a resistor R2 to the gate of the FET 4 (at connection point depicted by P1). The FET 4 is activated or inactivated in response to a pulse outputted from the pulse generator 5a. The connection point P1 is connected to the source S of the FET 4 via series Zener diodes ZD1 and ZD2 disposed in opposite directions to have reverse polarities for protecting the FET 4 (connection point P2).

The integrator 10 is selectively connected to the connection point P1 via the controller 5. The integrator 10 of this embodiment includes the resistor R2, a switch Q1, and a capacitor C1. The connection point P1 is connected to a collector of the switch Q1 in the form of a transistor. An emitter of the transistor Q1 is connected to the connection point P2 via the capacitor C1. The resistor R2, the capacitor C1 and the transistor Q1 constitute an integrator having a predetermined time constant. A base, a control input terminal, of the transistor Q1 is connected to the output terminal of the integrator controller 5b.

The output of the pulse generator 5a is connected both to the collector of a transistor Q2 functioning as a switch for bypass and to the base of the transistor Q2 via an inverter 6. The emitter of the transistor Q2 is connected to the connection point P2. The switch Q2 is activated at the instant of completion (at the falling) of each pulse to bypass extra charges, thereby speedily deactivating the switch 4.

Both terminals of the resistor R1 for detecting the current supplied to the load are connected to the respective input terminals of a differential amplifier 7. The output terminal of the amplifier 7 for amplifying a difference in voltage across the resistor R1 for output is connected to the plus (non-inverting) input terminal of a comparator 8. A reference voltage Vref is supplied to the minus (inverting) input terminal of the comparator 8.

The comparator 8 compares a voltage value V1 outputted from the amplifier 7 with a predetermined reference voltage Vref. When V1 is greater than Vref, the comparator 8 outputs an "H" level signal indicating a first state, for example. When Vref is greater than V1, the comparator 8 outputs an "L" level signal indicating a second state. A latch circuit 9 for holding an output state of the comparator 8 for a predetermined time period is a RS flip-flop connected with the output of the comparator 8.

When receiving an "H" level signal from the comparator 8, the latch 9 holds the signal for a predetermined time period and outputs the signal as a latch signal to the integrator controller 5b. When receiving a latch reset signal from the integrator controller 5b, the latch 9 releases the holding state.

A load current detector 12 for detecting the current supplied to the load and amplifying the current for output includes the resistor R1, the comparator 8, and the latch circuit 9 in this embodiment.

Figure 4:
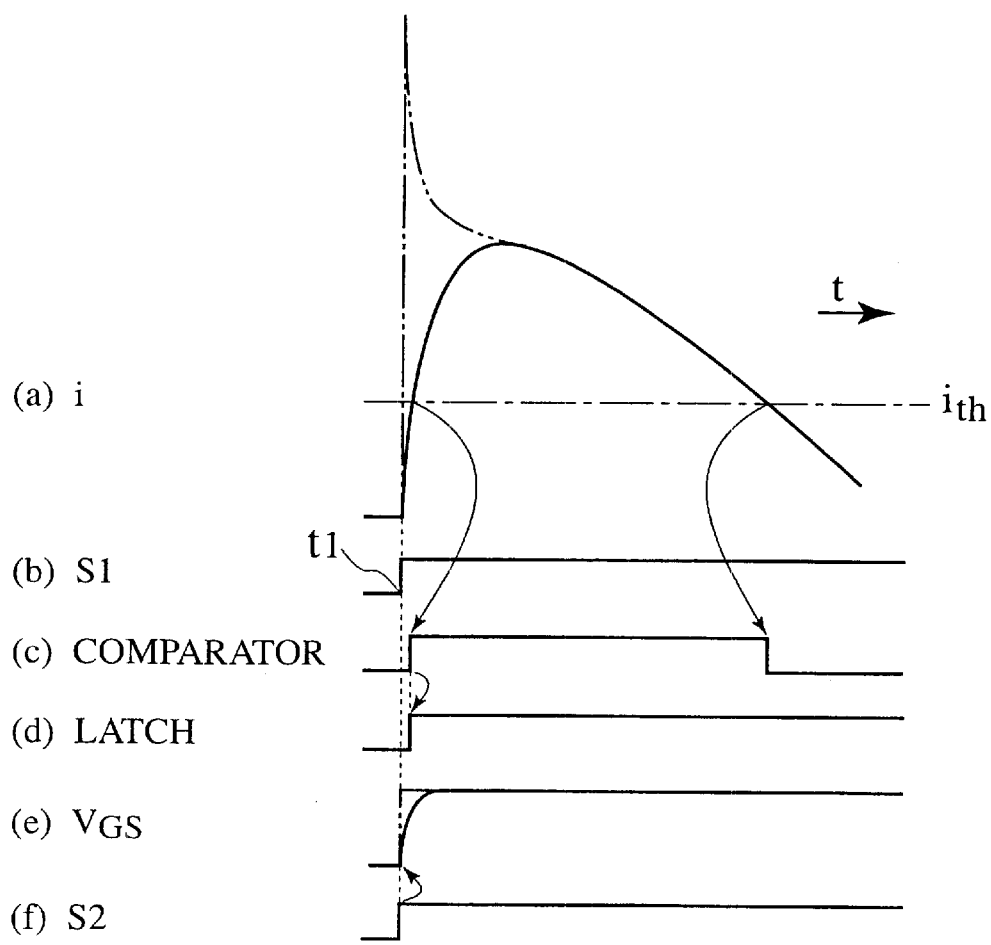
FIG. 4 is a timing chart illustrating an enlarged waveform portion taken in FIG. 3A.

FIGS. 3A and 3B are timing charts illustrating signal waveforms at respective parts of the load driving system 1 of this embodiment. FIG. 4 is a timing chart illustrating an enlarged current waveform portion taken in FIG. 3A. The operation of this embodiment will be described below with reference to those figures.

To start driving the load 2, the pulse generator 5a of the controller 5 outputs a rectangular pulse signal S1 having a desired duty ratio (FIG. 3A(b)). The pulse signal S1 is applied to the gate of the FET 4 via the resistor R2. A driving voltage is thus applied between the gate and source of the FET 4, activating the FET 4, thereby supplying current through a loop formed by the DC power source 3, load 2, FET 4, resistor R1, and ground (at time t0 in FIG. 3A(a)).

At that time, the integrator controller 5b outputs a slow signal S2 synchronized with the pulse signal S1 (FIG. 3A(f)). The slow signal S2 is supplied to the base of the transistor Q1 constituting part of the integrator 10, which will be described later. Thus the transistor Q1 functioning as a switching element turns on, electrically connecting between the resistor R2 and the capacitor C1. As a result, the voltage at the connection point P1 gradually increases due to the integration characteristics with a time constant determined by the resistance of the resistor R2 and the capacitance of the capacitor C1.

Thus the pulse signal S1 outputted from the pulse generator 5a gradually increases in voltage value during rising. This controls the current value of the load 2 during rising to rise gradually, limiting an inrush current during rising. As will be readily appreciated by those skilled in the art, the integrator 10 is not limited to the construction of this embodiment and can be modified to ensure desired integration characteristics depending on a load.

The current supplied to the load 2 passes via the FET 4 through the resistor R1, generating a voltage proportionate in magnitude to the current value across the resistor R1. A voltage difference in proportion to the load current is amplified by the differential amplifier 7 which supplies an output voltage V1 to the non-inverting input terminal of the comparator 8. When the value of inrush current flowing through the load 2 is still greater than a predetermined current value after the above processing, the output voltage V1 of the amplifier 7 is still greater than the reference voltage Vref. The comparator 8 thus outputs an "H" level signal. The latch circuit 9 holds the signal and outputs the signal to the integrator controller 5b contained in the MPU 5 (FIG. 3A(d)).

When detecting the latch signal supplied by the latch circuit 9, the integrator controller 5b outputs a slow signal S2 in synchronization with the next pulse signal S1. Thus the slow signal S2 is supplied to the base of the transistor Q1, forming an integration circuit with the resistor R2 and the capacitor C1, thereby limiting an inrush current flowing through the load 2 in the same manner as described above. When detecting the input of the latch signal, the integrator controller 5b determines the flow of inrush current exceeding a predetermined value, and then outputs a latch reset signal as shown in FIG. 3A(e) to the latch circuit 9 to release the holding state.

Specifically, with reference to FIG. 4, when the pulse signal S1 is outputted at time t1 as shown in FIG. 4(b) and the slow signal S2 is outputted as shown in FIG. 4(f), the gate-source voltage VGS of the FET 4 increases gradually as shown in FIG. 4(e). This prevents the waveform of the current flowing through the load 2 from becoming such a large inrush current as shown by a broken line in FIG. 4(a), and suppress it as shown by a solid line. When the load current value exceeds a predetermined value (current value corresponding to the reference voltage Vref), the output of the comparator 8 becomes an "H" level. In response to the output signal from the comparator 8, a latch signal holding the output level is outputted. Receiving the latch signal, the controller 15 outputs the slow signal S2 in synchronization with the next pulse signal S1.

After a lapse of time, the load 2 is heated and normally operates, which reduces inrush current, lowering the value of an inrush current flowing through the resistor R1. The voltage V1 outputted from the amplifier 7 resultantly becomes smaller than the reference voltage Vref. The comparator 8 thus maintains an "L" level of its output signal as shown in FIG. 3B. The latch circuit 9 also maintains this level. Accordingly, at the next output of the pulse signal S1, a slow signal pulse S2 is not outputted. The switch Q1 is thus not activated and the integrator 10 does not operate. This allows an integrator to operate only when an inrush current is generated at the start of the operation of a load and to be stopped its operation when the operation of the load is stabled and no significant rush current exists.

In the load driving system 1 of this embodiment, when the FET 4 is turned on by the rectangular pulse signal S1 outputted from the pulse generator 5a and the value of the current flowing through the load 2 is greater than a predetermined value, the slow signal S2 is outputted in synchronization with the next pulse signal S1, gradually rising the current flowing through the load 2. This enables limiting the generation of an inrush current, preventing the application of great stress to the load 2, resulting in an extended life of the load 2.

When the load 2 is heated to be in a steady state and the value of the current flowing through the load 2 becomes smaller than a predetermined value, the normal pulse signal S1 directly controls the FET 4 without the slow signal S2 outputted, enabling the reduction in heat generating amount of the FET 4.

Through the use of the latch circuit 9 for holding the output of the comparator 8, the MPU 5 can securely detect a latch signal during sampling. This allows for the selection of a sampling speed (interval) required for the MPU 5 independently of a sampling speed required for detecting the output of a comparator. This also reduces the cost of hardware required for the sampling of the MPU 5.

Second Embodiment

Figure 5:
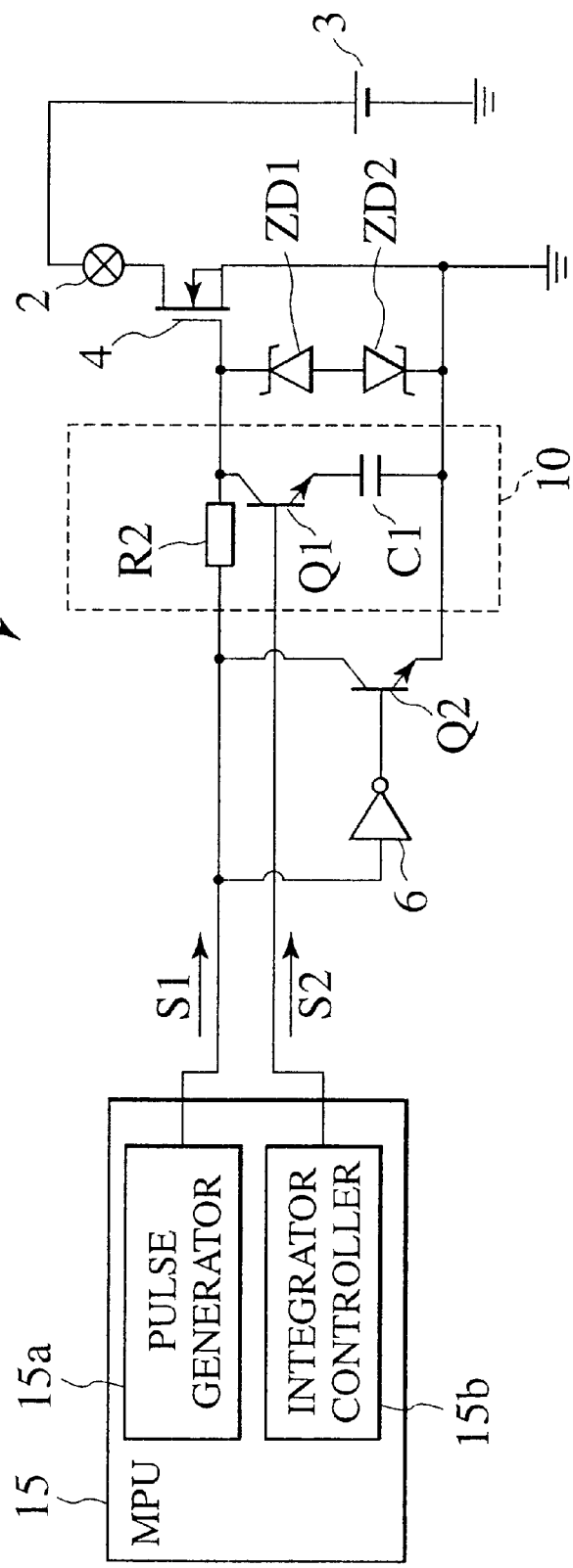
FIG. 5 is a circuit diagram illustrating the construction of a load driving system according to a second embodiment of this invention.

FIG. 5 is a circuit diagram illustrating the construction of a load driving system according to a second embodiment of this invention. As shown in the figure, a load driving system 11 is different from the load driving system 1 shown in FIG. 2 in that the system 11 omits the resistor R1, amplifier 7, comparator 8 and latch circuit 9. There is another difference that an integrator controller 15b of an MPU 15 outputs a slow signal S2 without receiving a latch signal. Other components of the system 11 are the same as those in the circuitry shown in FIG. 2, and are referred to with the same numerals to avoid redundant description thereof. In the appended claims, the load driving system 11 is referred to as a switching circuit.

The controller (MPU) 15 has a pulse generator 15a for outputting a pulse signal S1, and the integrator controller 15b for outputting a slow signal S2 in synchronization with the pulse signal S1 until a predetermined time has elapsed since the start of the output of the pulse signal S1 from the pulse generator 15a.

The operation of the load driving system 11 of the second embodiment is described below. As in the first embodiment described above, the slow signal S2 is outputted in synchronization with the pulse signal S1 at the start of the driving of the load 2. This causes the pulse signal S1 supplied to the gate of an FET 4 to rise with a predetermined time constant, thus limiting the generation of an inrush current supplied to the load 2. The integrator controller 15b outputs the slow signal S2 for a predetermined time period from the start of the output of the pulse signal S1. This causes an integrator 10 to operate for some time from the start of the driving of the load 2 until the inrush current is stabled (an initial driving period), suppressing the inrush current flowing through the load 2, thereby protecting the load 2.

When the inrush current is reduced after a predetermined lapse of time, the output of the slow signal S2 is stopped. This reduces the heat generation of the FET 4.

The integrator controller 15b is configured to output the slow signal S2 until a predetermined time has elapsed since the start of driving of the load 2. It is also possible to configure the controller 15b to output the slow signal S2 from the start of driving of the load 2 until the pulse signal S1 is outputted a predetermined number of times, thereby causing the integrator 10 to operate during the initial driving period. This configuration also provides the same effects as in the second embodiment.

The above description of the embodiments of this invention with reference to the drawings are not intended to limit this invention thereto. Each component may be replaced with any one having similar functions. For example, the MOSFET 4 is used in the above embodiments as a switching element, but a semiconductor switching element such as a bipolar transistor or IGBT may be used.

The load 2 is described as a lamp mounted to a vehicle. This invention is not limited to this application and can be applied to a load operative with specified power consumption.

As described above, a load driving system according to this invention operates an integrator when the current value of the load at the start of driving is large, to mitigate rising characteristics of a rectangular pulse signal causing a switch to turn on and off. This limits the generation of an inrush current flowing through the load, driving the load without undue stress, resulting in an extended life of the load.

When the current flowing through the load is stabilized and the inrush current value is reduced, the integrator is caused to stop its operation. This reduces the heat generation of the switching element. Accordingly, when a load designed for a normal driving voltage such as 12 volts is driven by a power source having a higher driving voltage of 52 volts, the load is prevented from being overloaded and is driven stably.

The entire content of a Japanese Patent Applications No. 2001-087611, filed on Mar. 26, 2001 is hereby incorporated by reference. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A switching circuit connected between a DC power source supplying a predetermined output voltage and at least one load, comprising:

a switch for switching on and off of the supply of the voltage outputted from the power source to the load;

a pulse generator for generating a pulse for controlling the switch;

an integrator connected with the switch for selectively integrating the pulse supplied to the switch; and a current detector for detecting the current supplied to the load, the current detector having first and second states, and outputting the first state when the current supplied to the load is greater than a predetermined value, or otherwise outputting the second state; wherein, the integrator operates for integration when the output from the current detector is the first state, and does not operate for integration when the output from the current detector is the second state.

2. A switching circuit connected to a DC power source which supplies a predetermined output voltage, for driving at least one load, comprising:

a switch for switching on and off of the supply of the voltage outputted from the power source to the load;

a pulse generator for generating a pulse for controlling the switch; and an integrator connected between the switch and the pulse generator for selectively integrating the pulse supplied to the switch; wherein, the integrator operates for integration from the start of the pulse generation until a predetermined time has elapsed or a predetermined number of pulses have been outputted.

3. A switching circuit of claim 1, wherein:

the integrator comprising an integration circuit having at least one resistor, and at least one capacitor and a second switch for selectively connecting the integration circuit with the switch; and the second switch is activated when the current detector is in the first state.

4. A switching circuit of claim 3, wherein the integration circuit has a predetermined time constant.

5. A switching circuit of claim 1, wherein:

the current detector comprising:

a resistive element connected in series to the load; and a comparator for comparing a detected voltage generating across the resistive element with a predetermined reference voltage, the comparator having third and fourth states, and outputting the third state when the detected voltage is greater than the reference voltage, or otherwise outputting the forth state.

6. A switching circuit of claim 5, further comprising a controller for controlling the pulse generator, the controller controlling the operation of the integrator in accordance with the output of the current detector.

7. A switching circuit of claim 6, wherein:

the controller detects by sampling the output of the current detector when the pulse generator outputs each pulse; and the output of the current detector is maintained until the completion of each detection.

8. A switching circuit of claim 1 or 2, wherein the power source is a battery mounted to a vehicle and supplies a voltage higher than a normal driving voltage of the load.

9. A switching circuit of claim 1 or 2, wherein the switch comprises an MOSFET.

10. A switching circuit of claim 3, wherein the second switch comprises a transistor.

11. A method of driving at least one load using a DC power source supplying a predetermined output voltage, comprising the steps of:

converting a voltage outputted from the power source to a pulse voltage for output;

detecting a current supplied to the load and comparing the detected current with a predetermined current value; and selectively integrating the pulse voltage based on the comparison result;

wherein, the pulse is integrated when the detected current is greater than the predetermined current value, and otherwise the pulse is not integrated.

12. A method of driving at least one load using a DC power source supplying a predetermined output voltage, comprising the steps of:

converting a voltage outputted from the power source to a pulse voltage for output;

detecting a current supplied to the load and comparing the detected current with a predetermined current value; and selectively integrating the pulse voltage based on the comparison result;

wherein, the pulse is integrated from the start of the output of the pulse voltage until a predetermined time has elapsed or the pulse voltage has been outputted a predetermined number of times, and the pulse is not integrated thereafter.

* * * * *